US008241942B2

(12) United States Patent  
Bourdelle et al.

(10) Patent No.: US 8,241,942 B2  
(45) Date of Patent: Aug. 14, 2012

(54) METHOD OF FABRICATING A BACK-ILLUMINATED IMAGE SENSOR

(75) Inventors: Konstantin Bourdelle, Crolles (FR); Carlos Mazure, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/123,661

(22) PCT Filed: Sep. 22, 2009

(86) PCT No.: PCT/EP2009/006845  
§ 371 (c)(1),  
(2), (4) Date: Apr. 11, 2011

(87) PCT Pub. No.: WO2010/072278  
PCT Pub. Date: Jul. 1, 2010

(65) Prior Publication Data  
US 2011/0287571 A1　Nov. 24, 2011

(30) Foreign Application Priority Data

Dec. 22, 2008　(EP) ..................... 08291227

(51) Int. Cl.  
*H01L 21/00* (2006.01)  
*H01L 21/30* (2006.01)  
*H01L 21/04* (2006.01)  
*H01L 21/425* (2006.01)

(52) U.S. Cl. ............ 438/75; 438/96; 438/455; 438/458; 438/459; 438/511; 438/517; 257/E31.047

(58) Field of Classification Search .................. 438/75, 438/89, 96, 455, 458, 459, 511, 517; 257/E31.047  
See application file for complete search history.

(56) References Cited

U.S. PATENT DOCUMENTS

| | | | | |
|---|---|---|---|---|
| 6,130,380 A | * | 10/2000 | Nakamura | 136/255 |
| 2006/0099773 A1 | * | 5/2006 | Maa et al. | 438/455 |
| 2006/0186560 A1 | | 8/2006 | Swain et al. | 257/E27 |
| 2007/0210307 A1 | * | 9/2007 | Hebras | 257/52 |
| 2007/0235829 A1 | | 10/2007 | Levine et al. | 257/437 |
| 2008/0017946 A1 | | 1/2008 | Cazaux et al. | 257/447 |
| 2008/0079108 A1 | | 4/2008 | Hsu et al. | 257/460 |
| 2008/0124897 A1 | * | 5/2008 | Morimoto et al. | 438/459 |
| 2008/0224247 A1 | | 9/2008 | Hsu et al. | 257/432 |
| 2009/0173940 A1 | * | 7/2009 | Hwang | 257/53 |

OTHER PUBLICATIONS

International Search Report, PCT/EP2009/006845, mailed Nov. 9, 2009.

* cited by examiner

*Primary Examiner* — Kevin Parendo  
(74) *Attorney, Agent, or Firm* — Winston & Strawn LLP

(57) ABSTRACT

A method of fabricating a back-illuminated image sensor that includes the steps of providing a first substrate of a semiconductor layer, in particular a silicon layer, forming electronic device structures over the semiconductor layer and, only then, doping the semiconductor layer. By doing so, improved dopant profiles and electrical properties of photodiodes can be achieved such that the final product, namely an image sensor, has a better quality.

19 Claims, 2 Drawing Sheets

METHOD OF FABRICATING A BACK-ILLUMINATED IMAGE SENSOR

This application is a 371 filing of International Patent Application PCT/EP2009/006845 filed Sep. 22, 2009.

BACKGROUND

The invention relates to a method for fabricating a back-illuminated image sensor.

Such a method is, for example, known from US 2006/0186560 A1, which discloses a typical process flow for forming back-illuminated image sensors. This process flow comprises the following steps: First of all, a starting substrate is provided which can be either a silicon on insulator substrate with a silicon top layer with a thickness of about 500 nm or less or a bulk semiconductor substrate. Subsequently, a doping step is carried out to highly dope (N+ or P+) the silicon layer over a thickness of about 50 nm to 500 nm. The surface of the starting substrate is then prepared for a subsequent epitaxial growth step during which an epitaxial silicon layer with a thickness of about 1.5-5 µm is grown. This layer is lightly doped. Over this bi-layer structure (highly doped and lightly doped silicon layer), the electronic devices, such as CMOS imaging components etc, charge couple devices (CCD) components, are then formed using standard microelectronic processing from front end of the line through the back end of the line, i.e. the metallization steps.

Subsequently, a dielectric layer such as a TEOS or a nitride layer is deposited over the electronic devices. The role of this layer is to electrically isolate the back end of the line elements of imaging components and at least partially as a sacrificial layer for the subsequent planarization. The dielectric layer is then planarized, e.g. by chemical mechanical polishing (CMP) technique. The obtained structure is then attached, in particular by bonding, via the surface of the planarized dielectric layer to a handle wafer. The handle wafer can be a bare Si wafer with the native oxide or an oxidized Si wafer. The backside of the original starting substrate, thus the side opposite to where the electronic devices are provided, is then submitted to a Si material removal step, e.g. by grinding and TMAH etching. Following the material removal, the bi-layer structure of the highly doped and lowly doped silicon layer come closer to the backside surface. In case of a silicon on insulator substrate, the removed material can also incorporate the buried oxide (BOX) in the original SOI wafer, which can be removed by HF dip. Depending on the kind of sensor, the BOX can, however, also remain. Eventually, in a subsequent step, further additional layers, such as an anti-reflection lens etc, are fabricated over the bi-layer surface to obtain the final product.

US 2008/0224247 A1 proposes a different approach by first providing sensing elements on the front side of a substrate, to then carry out a thinning step of the backside and to subsequently carry out an implantation of p-type ions via the backside. To activate the implanted p-type dopants, a laser annealing is carried out.

The following problems can occur with the known methods for fabricating a backside illuminated image sensor, in particular with the method of the first prior art document mentioned above. The process steps of doping of the silicon layer, i.e. the necessary cleaning and the subsequent epitaxial growth step can lead to the degradation of physical and electrical properties of the buried semiconductor layers resulting in lower minority carrier lifetimes and increase in the dark current. Furthermore, the diffusion of dopants in the buried semiconductor layers during the processing of the electronic devices (e.g. the CMOS processing) dictates the need for thicker—typically about 1-3 µm thicker than standard layers which are in a range of 1-5 µm—silicon epitaxial layers underneath the photodiodes of the image sensor. In the second case, the electrically active fraction of the dopants is not sufficient.

The present invention now provides an improved method for fabricating a back-illuminated image sensor with improved active dopant profiles.

Accordingly, the improved method comprises the steps of: a) providing a first substrate comprising a semiconductor layer, in particular a silicon layer, b) forming electronic device structures over and/or in the semiconductor layer, c) removing, at least partially, the first substrate, d) amorphization of at least a part of the semiconductor layer and e) doping the semiconductor layer, in particular the amorphized region.

By carrying out the doping step after having fabricated the electronic devices for the image sensor, like CMOS or CCD components or pixel circuits, the invention enables a more precisely defined doping profile in the semiconductor layer, and unwanted diffusion of dopants is reduced as the doping step is moved towards the end of the fabrication process.

As there is no need for an additional silicon layer epitaxial growth to form the photoactive region, this area of the image sensor will be better protected from parasitic contamination and, as a consequence, an improved device performance can be achieved.

In addition, the step of amorphization of at least a part of the semiconductor layer and the doping enables a more efficient activation at a given temperature and thus a desired activation quality and/or efficiency can be obtained at lower temperatures compared to the prior art. This also allows to better protect the already fabricated electronic devices. In this context, amorphization means that the to be doped region is rendered amorphous.

Typically, the dopants, e.g. boron for p-type doping or As for n-type doping, are introduced by an ion implantation technique, however a plasma treatment could also be used.

The amorphization step can be preferably carried out before the doping step. In this case channelling distortions of the dopant ions can be prevented. By doing so, a better process control can be achieved, e.g. a more uniform doping across the wafer.

Nevertheless, according to a variant, the amorphization and the doping step can be carried out at the same time or the amorphization can also be carried out after the doping.

Preferably, the step of amorphization can comprise implanting ions of at least one of silicon, germanium, argon or xenon into the semiconductor layer or a plasma treatment. This represents an effective way of providing an amorphous layer. In case that amorphization and doping are carried out at the same time, a device using two ions beams, one for doping and one for amorphization can be used.

As dopants, one can e.g. use boron for a p-type dopant profile and phosphorus or arsenic for a n-type dopant profile.

Advantageously, the method can further comprise a step f) after step b) and before step c) of forming a levelling layer over the electronic device structures. With this layer, the flexibility of the process can be enhanced, by levelling, e.g. accompanied by a planarization, e.g. by CMP.

Preferably, the method can comprise a step g) after step f) of attaching, in particular by bonding, a second substrate to the levelling layer. Instead of bonding, attaching can also be achieved by an adhesive means. The second substrate provides mechanical support to the structure.

According to an advantageous variant, during step e), the doping can occur via the side opposite to the side where the electronic device structures are provided. Thus a negative impact on the fabricated electronic devices can be prevented.

Advantageously, the method can further comprise a step h) of activating the dopants. Preferably, this step h) can be carried out such that the temperature of the region comprising the electronic device structures is 450° C. or less. By doing so, the properties of already formed electronic components, e.g. junctions, will e.g. be less disturbed by diffusion. Additionally, the low temperature dopant activation process can prevent a degradation of metal interconnect layers due to melting.

According to a preferred embodiment, step h) can be carried out by the conventional thermal anneal (furnace or Rapid thermal processing), which, is preferably carried out at less than 450° C. (temperature in the region of the electronic devices), will lead to the removal of implant damage and the electrical activation of the dopants. During such an anneal a phenomenon called "solid phase epitaxial recrystallization", i.e. re-growth of the amorphous layer occurs. This step is of particular interest in case of electrical activation of boron as a doping species.

According to a variant laser, in particular, pulsed laser annealing can be advantageously used to activate the dopant in the amorphized layer. The pulsed laser annealing is preferably done in a melting regime. The advantage of the amorphization before laser anneal is as follows: The melting temperature of amorphous Si is significantly lower than that for the crystalline Si: 1420 K vs. 1690 K. For example, a KrF excimer laser (248 nm wavelength, pulse duration of about 20 ns) with the pulse energy density of about 0.5-0.6 J/cm$^2$ can be used to melt amorphous Si layers with a thickness of up to 50-60 nm and result high electrical activation of the dopants. The laser annealing of the amorphized layers allows to reduce the effective processing temperature in the regions of already formed electronic components compared to the prior art without amorphized layers.

According to another variant, a microwave activation can be advantageously used to activate the implanted dopants when the thickness of the layers (after thinning), is for example, more than 100 μm.

According to a preferred variant of the invention, step c) can be carried out such that only the semiconductor layer or a part thereof remains. Thus, light can reach the device from the backside, thus the side opposite to where the electronic device structures are provided, and the desired carrier concentrations can be created in the semiconductor layer.

Preferably, the first substrate can be one of a silicon wafer, a silicon on insulator wafer, a silicon germanium on insulator wafer (SiGeOI), a silicon germanium alloy (SiGe alloy), a germanium on insulator wafer (GeOI), a germanium wafer (Ge) and a gallium arsenide (GaAs) wafer.

In the case that a semiconductor on insulator type substrate is used, step c) can be carried out such that the grinding stops around 10-20 μm above the buried oxide (BOX). The following TMAH etch stops at the BOX. The BOX itself can then be left over or also removed. For the bulk substrates, the grinding stops around 10-20 μm above the bonding interface.

Further preferred, step f) can comprise forming a dielectric layer, in particular a TEOS or nitride layer. Thus levelling and electrical isolation can be achieved. Preferably, the dielectric deposition step can be followed by CMP planarization.

Advantageously, the second substrate can be one of a silicon wafer, a poly-Si substrate, a glass substrate and a quartz substrate. Actually, the main role of the second substrate is to provide the desired stability to the structure. Therefore, any kind of substrate which is readily available is suitable. Nevertheless materials are preferred which ensure close thermal expansion coefficients between the two substrates to prevent breaking of the bonded pair during a subsequent thermal treatment.

According to a preferred embodiment, step e) can comprise forming of a doping pattern, in particular of first zones with a first doping type and second zones, preferably in zones complementary to the first zones, with a second doping type. Patterning may be achieved by using a patterned mask. This feature improves the flexibility of the application.

Preferably, the electronic devices can comprise at least one of CMOS devices, CCD devices, photodiodes, phototransistors, pixel circuits and optoelectronic devices. For these kind of products a well defined dopant concentration profile leads to improved products.

BRIEF DESCRIPTION OF THE DRAWINGS

Advantageous embodiments of the invention will be described in the following in relation to the enclosed figures.

DETAILED DESCRIPTION OF THE PREFERRED EMBODIMENTS

Figure 1:
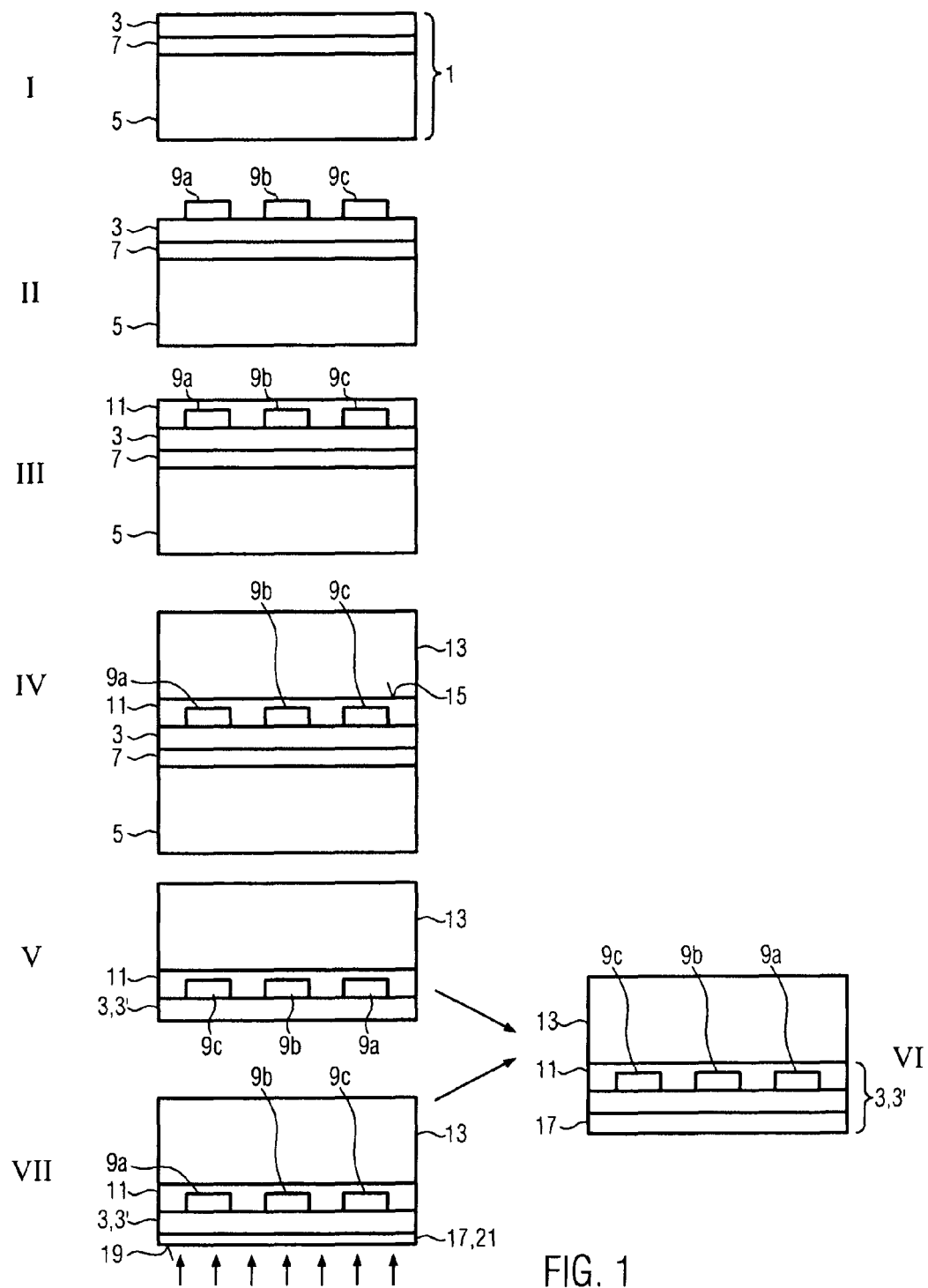
FIG. 1 illustrates one embodiment of the method of making a back-illuminated image sensor.

FIG. 1 illustrates the steps of the method of making a backside illuminated image senor according to the invention. Step I consists in providing a first substrate 1 comprising a semiconductor layer 3. In this embodiment, the first substrate 1 is a silicon on insulator (SOI) wafer, thus comprising a base substrate 5, a silicon oxide layer 7 and thereon a silicon layer 3. Typically the base substrate 5 is a silicon wafer but could also be a poly-Si substrate, a transparent substrate, like glass or quartz or any other suitable substrate. The dielectric layer in this embodiment is a silicon oxide layer but could also be a silicon nitride layer or combination of Si oxide and nitride layers. The silicon layer 3 in this embodiment has a thickness in a range of 200 nm to 5 μm. Instead of using a silicon on insulator substrate, a bulk substrate like a silicon wafer, silicon germanium on insulator wafer (SiGeOI), a silicon germanium alloy (SiGe alloy), a germanium on insulator wafer (GeOI), a germanium wafer (Ge) or a gallium arsenide (GaAs) wafer could be used according to a variant of the invention.

The next Step II in the fabrication process consists in forming electronic device structures 9a, 9b and 9c over and/or in the semiconductor layer 3. These electronic device structures can comprise at least one of CMOS components, CCD components, photodiodes, phototransistors, pixel circuits and/or optoelectronic devices as well as the necessary interconnect electrodes etc. Theses device structures 9a, 9b and 9c can be formed directly on the semiconductor layer or on additional intermediate layers (not shown).

Step III then consists in providing a levelling layer 11 over the electronic device structures 9a, 9b and 9c. This levelling layer 11 can be a dielectric layer, e.g. a TEOS (Tetraethyl orthosilicate) or silicon nitride layer, which would also have the advantage to already provide electric isolation. The thickness of the layer 11 is sufficient to cover the structures of the electronic device structures 9a, 9b and 9c. The dielectric deposition step can be followed by CMP planarization to obtain a smooth surface ready for a subsequent bonding.

Subsequently, according to Step IV, the structure obtained is attached to a second substrate 13. The second substrate 13 is a standard silicon wafer but could also be a poly-Si substrate, a transparent substrate, e.g. glass or quartz, or any other suitable transparent substrate. Attachment is achieved preferably via bonding via the surface 15 of the levelling layer 11. Bonding can occur either between the silicon surface of the second substrate 13 or via its natural oxide surface.

After the bonding, an optional step is a thermal annealing of the bonded pair to increase the bonding energy and prevent debonding during subsequent grinding.

The next Step V according to the invention consists in removing at least a part of the first substrate 1. In this embodiment, the base substrate 5 of the first substrate and the dielectric layer 7 are completely removed so that only the semiconductor layer 3 or a thinner part thereof 3' remains. According to further variants, at least a part of the dielectric layer 7 could also remain.

The material removal step V can, for example, be carried out by grinding and/or etching, but any known method could be used. In case of bulk silicon, material removal can be carried out by grinding, lapping and polishing. Subsequently, an additional cleaning step could be carried out.

Step VI consists in an amorphization step. At least a part 17 of the semiconductor layer 3, 3' is rendered amorphous by implanting silicon, germanium, argon and/or xenon ions. The amorphous region 17 has a thickness in the range of 10-400 nm.

According to the invention, the next step VII then consists in doping the semiconductor layer 3 or 3' and, in particular, the amorphous part 17 thereof to thereby form a highly doped area, in the vicinity of the surface 19 of the semiconductor layer 3 after removal of the base substrate 5 and the dielectric layer 7. In the following, the surface 19 will be called the "backside surface" (the electronic devices are on the opposite side) and when the image sensor is used, light will enter the device via this surface.

Following doping, a highly doped region 21 with a thickness of about 10-400 nm is achieved. The highly doped region 21 in this embodiment is close to the surface 19 and corresponds to the amorphous part 17, but could actually also be buried inside the layer 3, 3'. Typically, doping can be achieved by ion implantation, for example boron ions with an energy of 0.5-60 keV are implanted to form P+ doped regions and phosphor is implanted with an energy of 0.5-150 keV to form N+ doped regions. Typically, the dose implanted is in a range of $5 \times 10^{14}$ cm$^{-2}$ or above. Preferably, doping is achieved via surface 17, thus opposite to where the electronic devices are arranged. Thus a negative impact on the performance of the electronic device structures can be prevented.

Subsequently, the dopants are activated using a low temperature activation, meaning that the activation is carried out such that the temperature of the region comprising the electronic devices 9a, 9b and 9c remains at 450° C. or less. By doing so, it is prevented that the devices 9a, 9b, 9c are damaged, in particular by an unwanted diffusion of dopants present in the electronic structures of the transistors, etc. of the devices 9a, 9b, 9c. To carry out the activation a standard thermal anneal in a furnace or a rapid thermal process, but also a laser, in particular pulsed laser, annealing or microwave annealing could be applied. In case of a pulsed laser anneal, the laser wavelength is chosen such that it corresponds to penetration in silicon of, at most, 1 micron. In this case an XeCl excimer laser could be used. For the activation of thicker silicon films, a microwave activation with an appropriate frequency can advantageously be employed.

The thermal anneal (again at 450° C. or less in the region of electronic devices 9a, 9b, 9c) leads to a re-crystallisation of region 17 and, at the same time, to the electrical activation of the implanted dopants. As the melting point of amorphous silicon is lower than for the crystallized silicon, the desired re-crystallisation accompanied by the activation can be achieved at lower temperatures compared to a case without the amorphization step.

This method functions particularly well in case of a boron activation.

Following the activation of the dopant, further process steps can be carried out, for example, to provide colour filters and/or lenses and/or anti-reflection layers on the backside surface 19.

In the described embodiment, the amorphization step is carried out before entering the dopants, nevertheless without departing from the scope of the invention, it is also possible to carry out the two steps at the same time or even reverse the sequence, thus first doping and then the amorphization step. Furthermore, instead of ion implanting, a plasma could be used for the amorphization step and/or the doping step.

Figure 2:
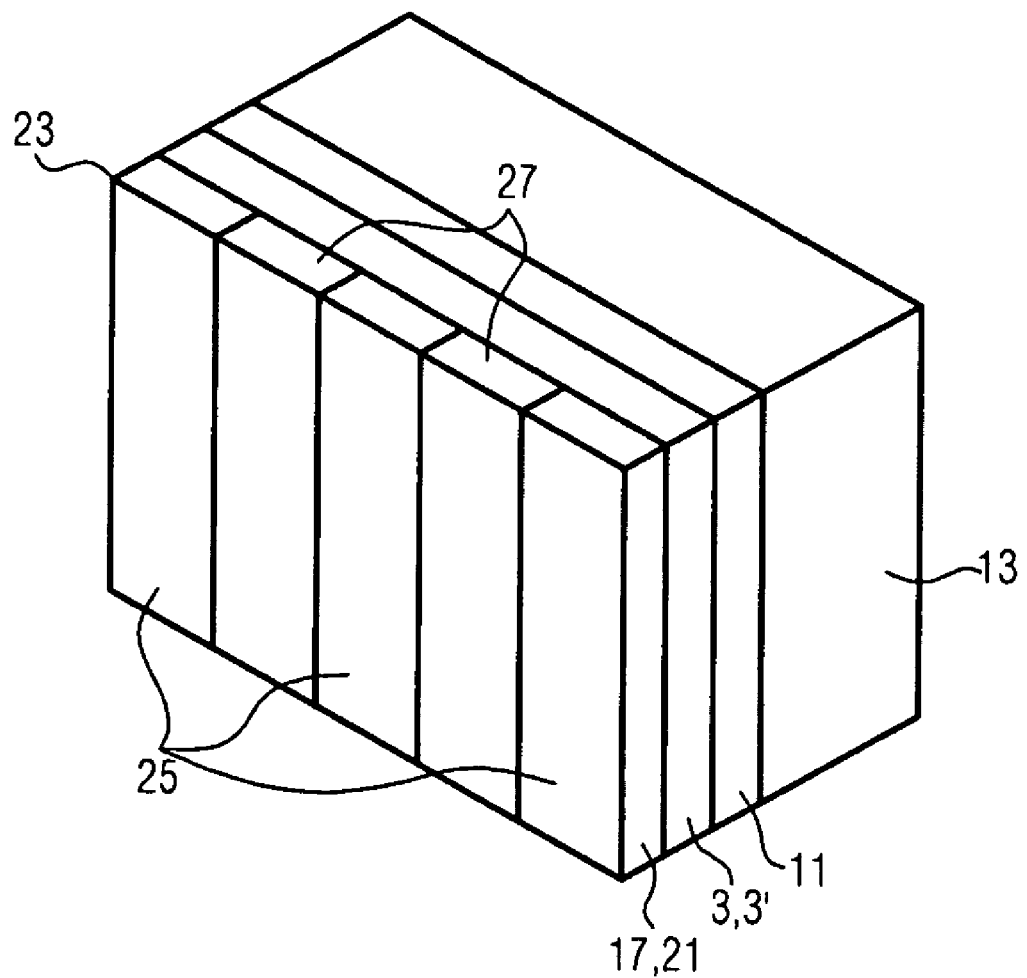
FIG. 2 illustrates a second embodiment of the method of making a back-illuminated image sensor.

According to a second embodiment, illustrated in FIG. 2, doping is carried out such that a doping pattern 23, e.g. using a mask, is achieved in the highly doped region 21. This leads to the formation of first zones 25 with a first doping type and second zones 27, preferably in zones complementary to the first zones, with a second doping type.

With the described methods, the photoactive silicon regions with reference numerals 3, 3' and 21 are better protected from parasitic contamination and, therefore, will lead to better backside illuminated devices than compared to the prior art processes during which the implanting and activating steps are carried out prior to forming the electronic devices.

Embodiments 1 and 2 comprise a step of attaching a second substrate 13 to the levelling layer 11. However, according to a further variant of the invention, the levelling layer could also be grown thicker than necessary to achieve levelling such that, even in case the base substrate 5 of the first substrate is completely removed, the overall structure is stiff enough for the final product. In this case the layer thickness should be at least 10 μm, preferably 100-200 μm.

As mentioned above, with the inventive method carrying out the doping after electronic devices are formed, a contamination of photoactive silicon region 3, 3' and 21 can be better prevented so that the final device quality is improved, as the activation efficiency can be improved by providing the amorphous layer. This is in particular seen in dark current and the dopant profiles.

What is claimed is:

1. A method of fabricating a back-illuminated image sensor which comprises:
    providing a first substrate comprising a semiconductor layer having a frontside and a backside,
    forming optoelectronic device structures upon or in the frontside of the semiconductor layer,
    at least partially removing a rear side of the first substrate,
    amorphizing at least a part of the backside of the semiconductor layer after the optoelectronic device structures are formed, and
    doping the amorphized part of the semiconductor layer.

2. The method of claim 1, wherein the semiconductor layer comprises silicon and is doped in the amorphized part of the semiconductor layer.

3. The method of claim 1, wherein the amorphizing comprises either implanting ions of at least one of Si, Ge, Ar or Xe into the semiconductor layer or conducting a plasma treatment on the semiconductor layer.

4. The method of claim 1, which further comprises forming a levelling layer over the optoelectronic device structures.

5. The method of claim 4, which further comprises bonding a second substrate to the levelling layer.

6. The method of claim 5, wherein the second substrate is one of a Si wafer, poly-Si substrate, or glass, quartz or a transparent substrate.

7. The method of claim 1, wherein the doping occurs in the layer on a side that is opposite to the side where the optoelectronic device structures are present.

8. The method of claim 1, which further comprises activating the dopants.

9. The method of claim 8, wherein the activating is carried out such that a temperature of the semiconductor layer comprising the optoelectronic device structures is 450° C. or less.

10. The method of claim 8, wherein the activating is carried out by one of conventional thermal annealing, rapid thermal annealing, laser or pulsed laser activation, or by microwave activation.

11. The method of claim 1, wherein the first substrate is removed such that the semiconductor layer remains, or such that part of the semiconductor layer that comprises the optoelectronic device structures remains.

12. The method of claim 1, wherein the first substrate is one of a Si wafer, a silicon on insulator wafer, a silicon germanium on insulator wafer (SiGeOI), a silicon germanium alloy (SiGe alloy), a germanium on insulator wafer (GeOI), a germanium wafer (Ge) or a gallium arsenide (GaAs) wafer.

13. The method of claim 4, wherein the levelling layer that is formed is a dielectric layer.

14. The method of claim 13, which further comprises planarizing the dielectric layer.

15. The method of claim 14, wherein the dielectric layer is a TEOS or nitride layer and the planarizing is CMP planarization.

16. The method of claim 1, wherein the doping is formed in a pattern.

17. The method of claim 16, wherein the pattern includes non-overlapping first and second zones, and wherein the first zones are of a first doping type and second zones are of a second doping type.

18. The method of claim 1, wherein the optoelectronic devices comprise at least one of CMOS devices, CCD devices, photodiodes, phototransistors, or pixel circuits.

19. The method of claim 1 wherein the first substrate is an SOI substrate comprising the semiconductor layer, a base substrate and a buried dielectric layer intervening between the semiconductor layer and the base substrate, and wherein the removing step further comprises removing the base substrate and the buried dielectric layer.

* * * * *